United States Patent
Braceras et al.

(10) Patent No.: US 7,120,732 B2
(45) Date of Patent: Oct. 10, 2006

(54) CONTENT ADDRESSABLE MEMORY STRUCTURE

(75) Inventors: George M. Braceras, Essex Junction, VT (US); Robert E. Busch, Essex Junction, VT (US)

(73) Assignee: International Business Machines Corporation, Armonk, NY (US)

(*) Notice: Subject to any disclaimer, the term of this patent is extended or adjusted under 35 U.S.C. 154(b) by 353 days.

(21) Appl. No.: 10/708,317

(22) Filed: Feb. 24, 2004

(65) Prior Publication Data

US 2005/0185436 A1   Aug. 25, 2005

(51) Int. Cl.
*G06F 12/00* (2006.01)

(52) U.S. Cl. .......................... 711/108; 365/49
(58) Field of Classification Search ............... 711/108; 365/49

See application file for complete search history.

(56) References Cited

U.S. PATENT DOCUMENTS

| | | | |
|---|---|---|---|
| 4,580,230 A | 4/1986 | Jones et al. | |
| 5,226,005 A | 7/1993 | Lee et al. | |
| 5,428,565 A | 6/1995 | Shaw | |
| 5,862,086 A | 1/1999 | Makimura et al. | |
| 6,191,970 B1 | 2/2001 | Pereira | |
| 6,215,707 B1 | 4/2001 | Moyer | |
| 6,831,850 B1* | 12/2004 | Pereira et al. | ........... 365/49 |
| 2002/0080665 A1 | 6/2002 | Hata | |
| 2003/0065880 A1 | 4/2003 | Gordon et al. | |
| 2003/0123269 A1 | 7/2003 | Gillingham et al. | |
| 2003/0137890 A1 | 7/2003 | Vlasenko et al. | |

* cited by examiner

*Primary Examiner*—Nasser Moazzami
(74) *Attorney, Agent, or Firm*—Richard Kotulak, Esq.; Greenblum & Bernstein P.L.C.

(57) ABSTRACT

A structure, apparatus and method for reducing the power requirement of CAM memories, where the memory cells of the memory array are divided into groups of rows of multiple memory segments. Each memory segment has its own search driver and is searched separately. The memory segments are also searched in a prescribed order. If the search data is found in a particular memory segment, the search is stopped, leaving subsequent memory segments unsearched. By searching memory segments only until the search data is found, match lines of the subsequent memory segments are not unnecessarily discharge and recharged thereby reducing the current demands placed upon the power supply by the CAM memory. A selectable option to do a full search of the CAM memory is also provided for when the power supply is able to meet such current demands.

22 Claims, 4 Drawing Sheets

30

CONTENT ADDRESSABLE MEMORY STRUCTURE

BACKGROUND OF INVENTION

1. Field of the Invention

The invention relates to memory circuits, and more particularly to content addressable memory circuits.

2. Background Description

A content addressable memory (CAM) is a type of associated memory having an individual logic circuit associated with each memory cell or CAM entry. The individual logic circuits of each memory cell allow for simultaneously comparing the contents of each memory cell of the CAM in a single memory cycle. Because the entire contents of the CAM memory can be searched in one memory cycle, such memories may perform fast searches. CAM memory is especially useful for cache memory as a lookup table to point to an information location for information stored in conventional RAM (random access memory) memory.

As noted above, a benefit of a CAM is its ability to search all entries simultaneously. For example, a CAM that has 1K entries can be searched in one cycle, while a standard memory (SRAM or DRAM) would typically require 1000 cycles to determine if the desired data is present. Unfortunately, this beneficial aspect of a CAM can also cause functional problems. For example, by searching all the memory cells simultaneously, large current demands can result. Such large current demands typically depend on the specific data contents of the CAM with respect to the search data.

FIG. 1 illustrates a related art CAM array 10 comprising multiple memory cells 12. The memory cells 12 are arranged in rows 28 and columns 29 forming an array. The memory cells 12 in a particular row 28 are connected to one another by a match line 14. The match lines 14 of each row 28 are also connected to a hit logic circuit 19. The memory cells 12 in a particular column 29 are connected to one another by search lines 16. The search lines 16 couple the output of the search drivers 18 to the input of the memory cells 12. An output 32 of the hit logic circuit 19 is connected to the input of a priority logic encoder 24. The hit logic circuit 19 also outputs a hit/miss signal 22, and the priority logic encoder 24 also has a hit/adder output 26.

In operation, the search drivers 18 input the search data into the CAM array 10 through the search lines 16. If the memory cell 12 does not contain the target data, the memory cell 12 causes its associated match line 14 to discharge to ground. If the contents of a particular cell 12 match the applied data received, along its search line 16, the memory cell 12 will allow its match line 14 to remain high. Thus, if all the memory cells 12 in a row 28 match the search data received on the search lines 16, the match line 14 of that row 28 remains high indicating a match. Otherwise, the match line 14 is discharged to ground indicating a mismatch or miscompare, in at least one of the cells 12 on the match line 14. At the end of a search cycle, all the discharged match lines 14 are precharged to a high state in preparation for the next search cycle.

For the CAM architecture of FIG. 1, a miscompare on all the memory cells 12 will result in the discharge, and subsequent restore from low to high of all the match lines 14 within the CAM 10. In this case, all of the search lines 16 and all of the match lines 14 will be switched from low to high within one CAM cycle, causing a large current demand on the power supply powering the CAM memory 10. If previous CAM 10 search cycles resulted in mostly successful compares (or simple CAM writes), and the match lines 14 were not switched, then the instantaneous demand for the peak current may result in significant power supply noise (known as di/dt noise1).

Accordingly, large CAM circuits may draw more current than the power supply can deliver and cause the system to malfunction. Therefore, it has become necessary to define a CAM architecture that can reduce current demand.

SUMMARY OF INVENTION

The invention includes memory circuits which may be searched quickly and require low power to operate. The invention includes a class of memory circuits known as content addressable memory circuits, and includes a method and circuitry to selectively search such a memory segment-by-segment in order to conserve power requirements. In a first aspect of the invention, a method is provided for a content addressable memory having multiple memory segments defining at least a first and second memory segments. The content addressable memory also has a search control circuit configured to search the at least first and second memory segments in a prescribed order for certain data and to stop the search when the certain data is found.

Another aspect of the invention includes a content addressable memory having a first array of memory cells, and a second array of memory cells. Also included is a search logic circuit configured to prevent the discharge of the second array of memory cells when a search of the first array of memory cells finds certain data.

Another aspect of the invention is a method of searching a content addressable memory, including providing multiple memory cells in at least a first and second memory segment. The aspect also includes searching the at least first memory segment for certain data, and stopping the search before searching the second memory segment if the certain data is found in the first memory segment.

Another aspect of the invention includes dividing a content addressable memory into at least a first and second memory segment, and searching the at least first memory segment before searching the at least second memory segment in a prescribed order for certain data. The aspect also includes wherein if the certain data is found in the first memory segment, stopping the search, and if the certain data is not found in the at least first memory segment, continuing the search in the at least second memory segment.

Another aspect of the invention includes a computer program product comprising a computer usable medium having readable program code embodied in the medium, the computer program product including at least one program code to search a first memory segment of a content addressable memory for search data, and search a second memory segment of the content addressable memory for certain data only if the certain data was not found in the first memory segment.

DETAILED DESCRIPTION

The invention provides a CAM memory which may be configured to have reduced current demands. The invention also provides a CAM memory selectably configurable between a state with reduced current demands with only a slight performance loss or a full performance state requiring typical CAM current. Additionally, the CAM memory may be repeatably switched between a state with reduced current demands with only a slight performance loss or a full performance state.

The CAM of the invention permits a discrete amount of memory cells to be searched, and not discharging all the match lines of all the mismatched cells in a search cycle. Consequently, groups of complete rows are sequentially searched group-by-group until a match is found. Once a match is found, no further rows are searched, and the match lines of the unsearched rows are not discharged to ground.

Figure 1:
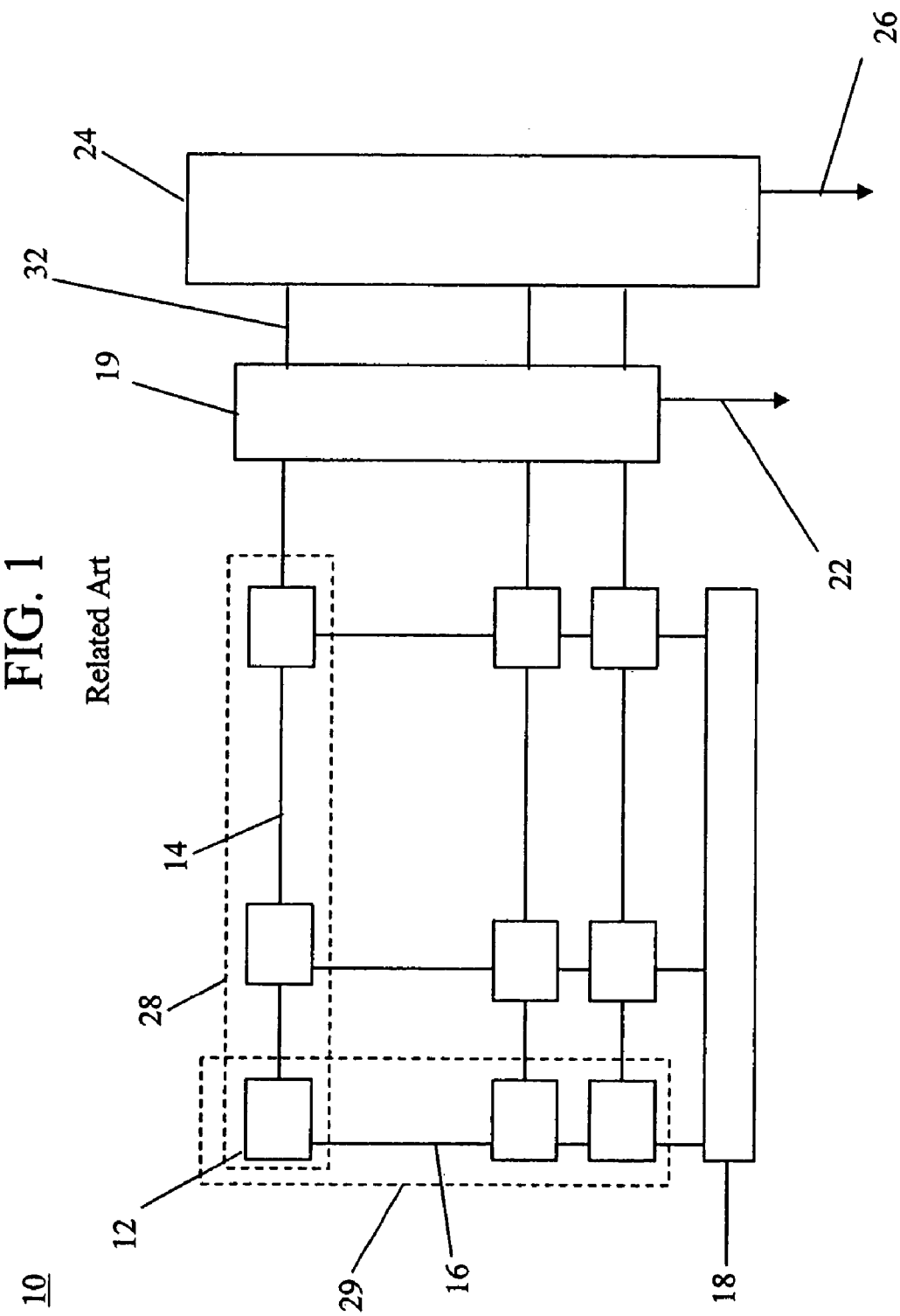
FIG. 1 is an illustration of a related art CAM memory.
Figure 2:
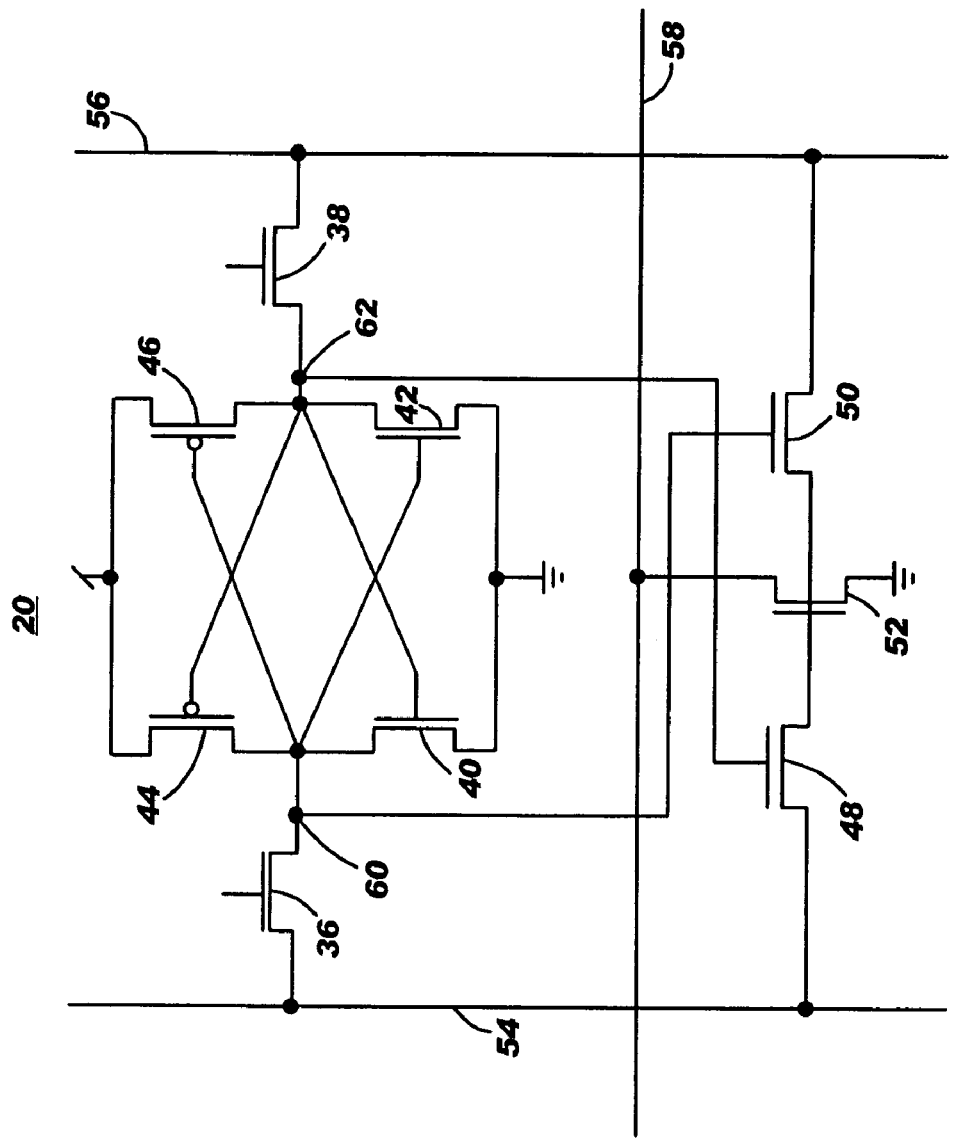
FIG. 2 is an illustration of a CAM memory cell in accordance with the invention.

Referring now to the drawings, FIG. 2 shows an example of a CAM cell 20 which may be used with the invention. It should be noted that virtually any type of CAM cell structure will function with the invention, and the structure of CAM cell 20 is used merely for illustrative purposes. The CAM cell 20 includes six transistors $T_1$–$T_6$ denoted as reference numerals 36, 38, 40, 42, 44 and 46, which form a six-device SRAM (static random access memory) cell. The SRAM can be written to or read from in the conventional manner. In addition, three transistors, $T_7$–$T_9$, designated as 48, 50 and 52, form a compare portion of the CAM cell 20.

Still referring to FIG. 2, the transistors $T_1$ and $T_7$, 36 and 48, are coupled to a first search line 54, and the transistors $T_2$ and $T_8$, 38 and 50, are coupled to a second search line 56. The first and second search lines 54 and 56 may also be referred to as true and compliment signals, respectively. The transistor $T_9$ 52 is coupled to ground and a match line 58. The transistors $T_1$, $T_3$, $T_5$ and $T_8$, 36, 40, 44, and 50, are coupled together at node "A" 60. The transistors $T_2$, $T_4$, $T_6$ and $T_7$, 38, 42, 46 and 48, are coupled together at node "B" 62.

During a CAM search operation, the match line 58 is precharged high, while the first and second search lines 54 and 56 are precharged low. Data applied to the search lines 54 and 56 will drive either the first search line 54 or the second search line 56 high in accordance with the search data. Depending on the data contained in the particular cell 20, the corresponding match line 58 will either remain in its precharged state (e.g., search data matches the cell 20 contents), or discharge to ground (e.g., search data mismatches the cell 20 contents).

For example, if the CAM cell 20 contains a logical "0," node "A" 60 will be low and node "B" 62 will be high prior to a search of the cell. If a logical "1" is applied to the search lines 54 and 56, the first search line 54 will drive high, while the second search line 56 remains in its precharged low state. With both a gate and source of transistor $T_7$ 48 high, the match line 58 will be discharged through the transistor $T_9$ 52 to indicate a miscompare.

On the other hand, when a logical "0" is applied to the first and second search lines 54 and 56, the first search line 54 remains low and the second search line 56 drives high when searched. Under these conditions, transistor $T_9$ 52 cannot be turned on and the match line 58 will remain high, indicating a match has occurred. In some implementations configured to reduce power consumption, the CAM cell 20 may be designed to reverse the polarity of the precharge in an attempt to reduce the overall average power requirement of the CAM memory. However, this may limit the voltage swing on the match signal and to only allow match line switching when a hit occurs.

In some CAM memory implementations, the signal match line 58 is precharged low. At the start of the compare process, the pre-charge on the match line 58 is turned off and a pull-up device is activated to pull the signal match line 58 high. If the CAM cell 20 contents are not matched, and transistor $T_9$ 52 is on, the match line 58 can not be pulled high, resulting in a miss signal on the match line 58. When the transistor 52 is off (e.g., CAM cell 20 matches the search data) the pull-up device will charge the match line 58 high and a hit will be detected. Also, in some implementations, CAM cells alternatively allow the match line 58 to remain at ground for a mismatch and transition to high for the case of a match. For such CAM designs, the peak power draw will occur if all entries compare, resulting in all match signals switching to high simultaneously and causing a large current draw.

Figure 3:
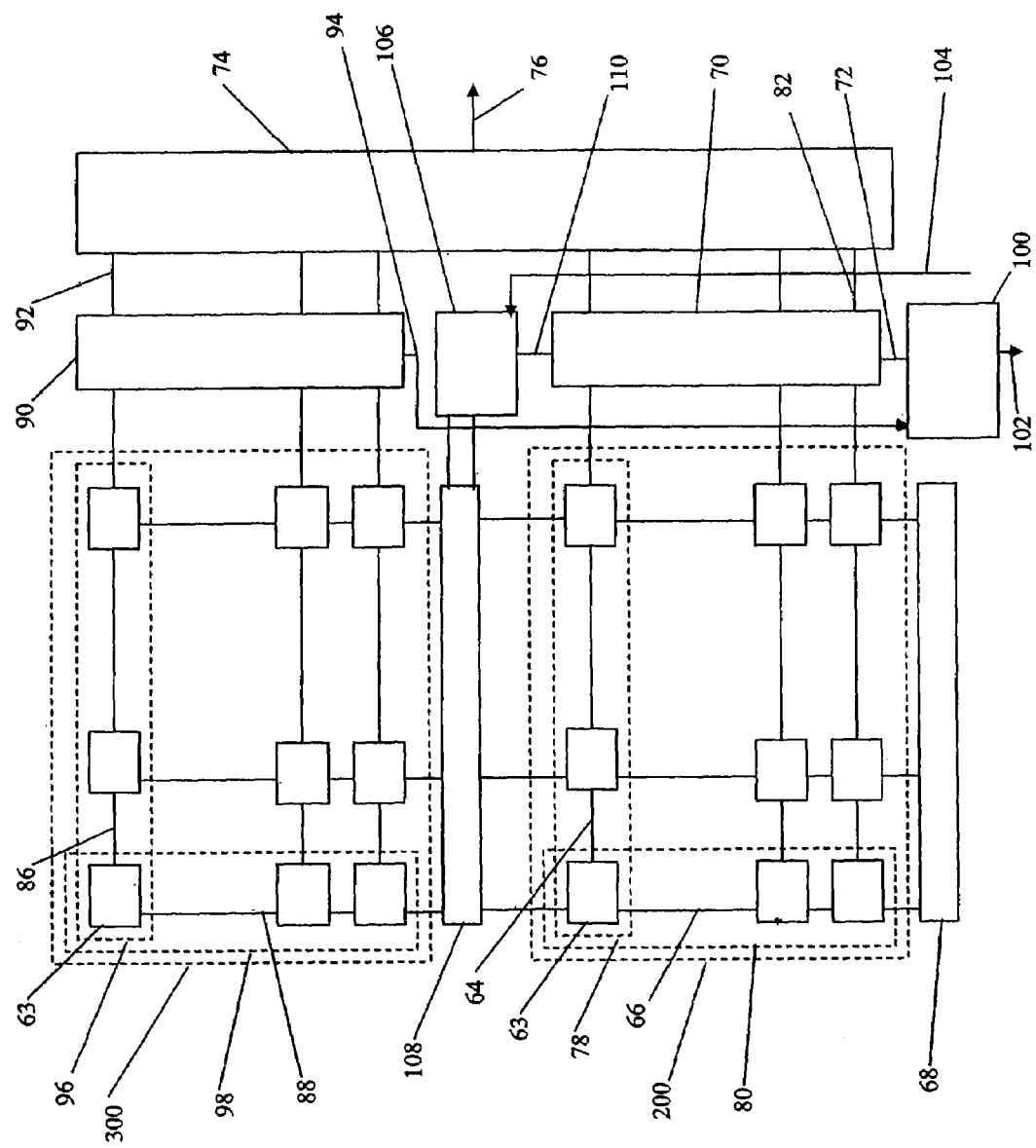
FIG. 3 is an illustration of an example of a CAM memory in accordance with the invention.

FIG. 3 shows an example of a CAM memory 30 using the CAM cells 20 of FIG. 2 with an additional search control circuit. The search control circuit includes all components used to search the array or arrays of CAM cells 20 of the CAM memory 30, as explained below. It should be noted that, if applicable, the CAM 30 memory of FIG. 3 may also use other related CAM cells and still fall within the scope of the invention. The CAM memory 30 has first and second memory segments 200 and 300.

It should be understood by those of skill in the art that the CAM memory 30 may also include three or more segments, all constructed in accordance with the invention. Thereby, the structure of FIG. 3 is provided for an illustrative embodiment, and is not meant to limit the scope of the invention to only the two segments 200 and 300.

First memory segment 200 has multiple memory cells 63. The memory cells 63 are arranged in rows 78 and columns 80 forming an array. The memory cells 63 in each particular row 78 are connected to one another by a corresponding match line 64. The match lines 64 of each row 78 are also connected to a first hit logic circuit 70. The memory cells 63 in each particular column 80 are connected to one another by corresponding search lines 66. The search lines 66 couple the output of a search driver 68 associated with the memory segment 200 to the input of the cells 63. The output 82 of a first hit logic circuit 70 is connected to the input of a priority logic encoder 74. The first hit logic circuit 70 also outputs a hit/miss signal 72 to a hit arbiter 100. The priority logic encoder 74 provides a hit/adder output 76.

In this aspect of the CAM memory 30, the second memory segment 300 has a structure similar to the first memory segment 200. Specifically, the second memory segment 300 has multiple memory cells 63. The memory cells 63 are arranged in rows 96 and columns 98 forming an array. The memory cells 63 in each particular row 96 are connected to one another by a corresponding match line 86. The match lines 86 of each row 96 are also connected to a second hit logic circuit 90. The memory cells 63 in each particular column 98 are connected to one another by corresponding search lines 88. The search lines 88 couple the output of the second memory segment"s 300 search driver also referred to as the second search driver 108, to the input of the cells 63. The output 94 of the second hit logic circuit 90 is connected to the input of the priority logic encoder 74. The second hit logic circuit 90 also outputs a second hit/miss signal 94 to the hit arbiter 100.

As shown in FIG. 3, the CAM memory 30 is segmented along the dimension of the search lines, 66 and 88. In other words, the memory segments 200 and 300 of the CAM memory 30 are formed by subdividing the array along the dimension of the rows and leaving the CAM memory 30 intact along the dimension of the columns. With such an organizational structure, a row is searched in its entirety, if it is searched at all. Additionally, if a match occurs in a memory segment, the match occurs for the entire search data string because entire rows are searched, rather than a part of a row.

Accordingly, the first search driver 68 provides the search data to the first memory segment 200, and the second search driver 108 provides the search data to the second memory segment 300. Additionally, the first hit logic circuit 70 receives the match line (64) signals from the first memory segment 200, and the second hit logic circuit 90 receives the match line (86) signals from the second memory segment 300. Both the first and second hit logic circuits 70 and 90 are coupled to the priority encoder 74.

The first hit logic circuit 70 also has a search control output 110 which is coupled to an extended search control circuit 106. The extended search control circuit 106 may output a signal to the second search driver 108. The extended search control circuit 106 is also configured to receive a full power search signal 104. Additionally, first and second search drivers, 68 and 108, may include multiple individual drivers, one for each respective column, 80 and 98, of the CAM memory 30.

In operation of the CAM memory 30, first search drivers 68 will start the CAM search operation. The search lines 66 of the first memory segment 200 are activated at the start of a search, but search lines 88 of the second memory segment 300 are blocked at the second search driver 108, leaving the second segment memory segment 300 inactive. If a hit is detected in the first memory segment 200, there is no need to continue searching the remaining second memory segment 300 of the CAM memory 30 and further searching is halted. If the CAM memory 30 were to have further memory segments beyond the second memory segment 300, such memory segments would also be left unsearched.

If the search data is found in the first memory segment 200, the first hit logic circuit 70 will detect the hit and indicate a hit to the extended search control logic circuit 106. The extended search control logic circuit 106 will then prevent the second search driver 108 from being activated. Thus, there will be no searching of the second memory segment 300, with the associated discharging and recharging of match lines corresponding to miscompare cells.

Alternatively, a first memory segment 200 miss or miscompare has occurred if a hit is not detected within a specific period of time (a CAM mimic path is one way of determining such timing). Consequently, the extended search control circuit 106 will activate the second search driver 108 to continue the search operation in the second memory segment 300. Whether a hit or a miss occurs in any of the memory segments 200 and 300, the hit arbiter circuit 100 receives signals from the first and second hit logic circuits 70 and 90 and outputs the hit/miss information 102 from the corresponding memory segment. This same process can continue any number of times corresponding to the number of segments in the CAM memory 30.

In particular, the extended search control circuit 106 receives a signal from the first hit logic circuit 70 indicating whether a hit occurred in the first memory segments 200. The extended search control circuit 106 then controls whether the second memory segment 300 is searched by controlling the second search driver 108. For example, if a hit occurred in the first memory segment 200, the extended search control circuit 106 sends a signal to the second search driver 108 blocking the transfer of the search data signal from the first memory segment 200 to the second memory segment 300. As such, the second memory segment 300 remains unsearched. If the extended search control circuit 106 receives a signal indicating no hit occurred in the first memory segment 200, the extended search control circuit 106 sends a signal to the second search driver 108 to pass search data received from the first memory segment 200 to the second memory segment 300, thereby causing the second memory segments 300 to be searched.

Additionally, the extended search control circuit 106 may receive a signal 104 indicating that all memory segments should be searched simultaneously. In accordance with such a signal, the extended search control circuit 106 sends a signal to the second search driver 108 to pass the search data to the second memory segment 300 regardless of whether any hit occurs in the first memory segment 200.

The match lines 64 and 86 from each row 78 and 96, feed into the respective hit logic circuits 70 and 90. It is here that the match lines 64 and 86 are precharged high and subsequently analyzed to determine whether a hit or miss has occurred in the corresponding memory segments 200 and 300. During a search, a match or a miss output signal may be generated in the hit logic circuits 70 and 90. In some applications, information from the hit logic circuits 70 and 90 is transmitted to the priority encoder 74. The priority encoder 74 receives signals from the first hit logic circuit 70 and the second hit logic circuit 90. The priority encoder 74 analyzes the signals received from the first and second hit logic circuits 70 and 90 and determines whether a hit has occurred. If a hit has occurred, the priority encoder 74 outputs a signal 76 which indicates a hit has occurred and also includes the address of the hit. If more than one hit has occurred in a search memory segment, the priority encoder 74 outputs the address of the first hit.

Where the CAM memory 30 stores duplicate data in the first and second memory segments 200 and 300, the only information needed by the system is the fact that a hit has occurred and the memory address of this first hit. This is true whether the duplicate data is stored in a single memory segment and produces multiple hits, or spread across both memory segments 200 and 300. Thus, no power is wasted on redundant searching after at least one hit in the first memory segment 200.

Alternatively, a full power search signal 104 is available if the power supply powering the CAM memory 30 can handle the CAM's maximum power requirement. For example, some search applications prevent multiple hits (or just limit the maximum number of possible hits) from occurring and can therefore limit the maximum power by software control. In another example, the memory system may have adequate chip packaging and decoupling and can maintain a stable power supply under severe CAM switching loads. In such cases, overriding the extended search control 106 if there is adequate power can allow searching the entire CAM, regardless of memory segmentation and the number of hits. If the extended search control 106 is overridden, the full power search signal 104 is asserted and the second search driver 108 will simply pass the search data from the first memory segment 200 to the second memory segment 300 with minimum delay. Thus, the CAM memory 30 can be selectively searched without any decrease in performance associated with a power conserving segment-by-segment search.

Figure 4:
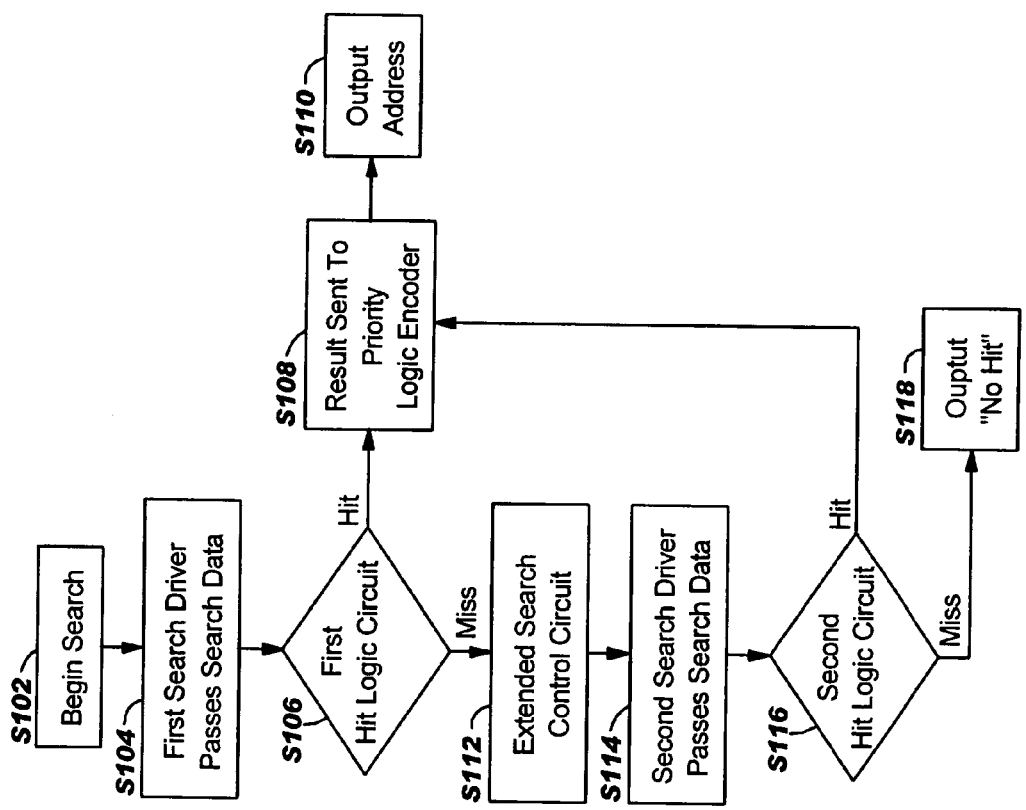
FIG. 4 is an illustration of a flow chart showing steps of using the invention

FIG. 4 is a flow diagram of an embodiment showing steps of using the invention. FIG. 4 may equally represent a high-level block diagram of components of the invention implementing the steps thereof. Thus, the steps of FIG. 4 may be implemented on a computer program code in combination with the appropriate hardware. This program code may be stored on a storage media such as a diskette, hard disk, CD-ROM, DVD-ROM or tape, as well as a memory storage device or collection of memory storage devices such as a read-only memory (ROM) or random access memory (RAM). Additionally, the computer program code can be transferred to a workstation over the Internet or some other type of network. FIG. 4 may also be implemented, for example, using the components of FIGS. 2–3.

At the beginning of the search S102, the match lines of each row of memory cells in each memory segment is charged high, while the search lines of each column of each memory segment are charged low. Search data is then received by the first search driver, which passes the search data to the first memory segment to be searched at S104. Upon receiving the search data, the first memory segment is searched, and the match line of each row registering a miss or miscompare is discharged to ground. Thus, any hits or misses in the first memory segment are indicated to the first hit logic circuit at S106. If there is a hit in the first memory segment, the hit is transmitted to the priority of logic encoder at S108 by the first hit logic, and the address of the row recording the hit is outputted by the priority of logic encoder at S110.

If the first memory segment does not contain the search data, each match line of the first memory segment is discharged to ground indicating no hits. A signal indicating no hits is then sent to be extended search control circuit by the first hit logic circuit at S112. The extended search control then signals the second search driver associated with the second memory segment that the first memory segment did not generate a hit, and the second search driver then passes the search data to the second memory segment at S114. Thus, the second memory segment is searched only if the first memory segment did not generate a hit.

Upon receiving the search data, the second memory segment is searched, and any row having a cell which records a miss discharges its match line to ground. The results of any hit in the second memory segment is received by the second hit logic circuit at S116, and is sent to the priority logic encoder by the second hit logic circuit at S108. The priority logic encoder outputs the address of any hit in the second memory segment at S110. Then steps S108 S116 may be repeated for each additional memory segment which exists in the array until the data is found, or all memory segments have been searched. If all memory segments are searched without a hit, a signal indicating the search data was not found is outputted at S118.

Given an ideal power supply able to deliver the power required by a CAM memory, segmenting the CAM memory, as described above, may cause the CAM search to take longer than if the memory was not segmented. However, this apparent time penalty is reduced if its compared to the CAM search delay or outright CAM failure of a conventional CAM when the power supply collapses (due to the large current fluctuations), as would typically happen without a CAM power reduction circuit.

What is claimed is:

1. A content addressable memory, comprising:
multiple memory segments defining at least first and second memory segments; and
a search control circuit configured to search the at least first and second memory segments in a prescribed order for certain data and to stop the search when the certain data is found.

2. The content addressable memory of claim 1, wherein the first memory segment is searched first, and the at least second memory segment is left unsearched if the certain data is found in the at least first memory segment.

3. The content addressable memory of claim 1, wherein each memory segment of the at least first and second memory segment comprises rows with a predetermined number of memory cells and columns with a predetermined number of memory cells which when combined together form a complete memory array.

4. The content addressable memory of claim 1, wherein at least one of the at least first and second memory segments comprises multiple memory segments.

5. The content addressable memory of claim 4, wherein the search control circuit is further configured to search all rows of each of the multiple memory segments searched.

6. The content addressable memory of claim 4, wherein the search control circuit is further configured to search all cells of all rows of each searched multiple memory segments.

7. The content addressable memory of claim 1, further comprising a circuit configured to allow all of the at least first and second memory segments to be searched regardless of whether the certain data is found in a particular memory segment.

8. The content addressable memory of claim 1, wherein the search control circuit comprises: a first search driver coupled to an input of the at least first memory segment; a first hit logic coupled to an output of the at least first memory segment; an extended search control coupled to an output of the first hit logic; a second search driver coupled to an output of the first search driver, an output of the extended search control, and an input of the at least second memory segment; and, a hit logic coupled to an output of the at least second memory segment.

9. The content addressable memory of claim 8, further comprising a hit arbiter coupled to the output of the first hit logic and the second hit logic and configured to produce a signal in accordance with whether the certain data is found.

10. The content addressable memory of claim 1, wherein the search control logic includes an extended search control circuit coupled to the first hit logic circuit and the second search control circuit and configured to receive a signal from the first hit logic circuit and cause the second search control circuit to begin a search of the at least second memory segment in accordance with the signal from the first hit logic circuit.

11. The content addressable memory of claim 8, further comprising a priority encoder coupled to the output of the first hit logic and the output of the second hit logic.

12. The content addressable memory of claim 1, further comprising a first search control circuit and a first hit logic circuit coupled to the at least first memory segment and a second search control circuit and a second hit logic circuit coupled to the at least second memory segment.

13. The content addressable memory of claim 1, further comprising the multiple memory cells organized into an array defining rows and columns of the content addressable memory, wherein the content addressable array is subdivided into memory segments along the dimension of the rows, and is not subdivided into memory segments along the dimension of the columns.

14. The content addressable memory of claim 1, further comprising an extended search control circuit coupled to the search driver.

15. A content addressable memory comprising:
a first array of memory cells;
a second array of memory cells;
a search logic circuit configured to prevent the discharge of the second array of memory cells when a search of the first array of memory cells finds certain data,
wherein the search logic circuit comprises an extended search control circuit connected between the first array of memory cells and the second search driver, and
wherein the extended search control circuit is configured to control whether the second array of memory cells is searched based on whether certain data is found in the first array of memory cells.

16. A method of searching a content addressable memory comprising the steps of:
providing multiple memory cells in at least a first and second memory segment;
searching the at least first memory segment for certain data; and
stopping the search before searching the second memory segment if the certain data is found in the first memory segment; and
continuing the search in the second memory segment if the certain data is not found in the first memory segment.

17. A method of searching a content addressable memory, comprising the steps of:
dividing the content addressable memory into at least a first and second memory segment;
searching the at least first memory segment before searching the at least second memory segment in a prescribed order for certain data;
wherein if the certain data is found in the first memory segment, stopping the search; and,
if the certain data is not found in the at least first memory segment continuing the search in the at least second memory segment.

18. The method of searching a content addressable memory of claim 17, wherein searching the at least first memory segment for certain data further comprises dividing the at least first memory into multiple rows of memory cells and searching all rows of memory cells of the at least first memory segment.

19. The method of searching a content addressable memory of claim 18, further comprising searching each row entirely of all the rows of memory cells of the at least first memory segment.

20. The method of searching a content addressable memory of claim 18, comprising searching the at least first and second memory segments simultaneously.

21. A computer program product comprising a computer usable medium having readable program code and body in the medium, the computer program product including at least one program code to:
search a first memory segment of a content addressable memory for search data; and
search a second memory segment of the content addressable memory for certain data only if the certain data was not found in the first memory segment.

22. The computer program product of claim 21, further comprising at least one program code to search all rows and all columns of the first memory segment, and search all rows and all columns of the second memory segment if the second memory segment is searched.

* * * * *